United States Patent
Velazquez

(10) Patent No.: US 8,085,175 B2
(45) Date of Patent: *Dec. 27, 2011

(54) LINEARIZER

(75) Inventor: Scott R. Velazquez, San Diego, CA (US)

(73) Assignee: V Corp Technologies, Inc., San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/079,293

(22) Filed: Apr. 4, 2011

(65) Prior Publication Data

US 2011/0175678 A1    Jul. 21, 2011

Related U.S. Application Data

(63) Continuation of application No. 12/817,075, filed on Jun. 16, 2010, now Pat. No. 7,940,198, which is a continuation-in-part of application No. 12/112,380, filed on Apr. 30, 2008, now Pat. No. 7,782,235.

(60) Provisional application No. 60/915,110, filed on Apr. 30, 2007, provisional application No. 61/187,546, filed on Jun. 16, 2009.

(51) Int. Cl.
H03M 1/06    (2006.01)

(52) U.S. Cl. .......... 341/118; 381/59; 375/233; 330/110; 455/126

(58) Field of Classification Search .......... 341/118–155; 381/59, 96, 98, 94, 93, 61; 375/233, 230, 375/232, 376, 296, 297, 257, 238; 330/110, 330/149, 52, 151; 455/126, 296, 114.3, 63.1, 455/127.2

See application file for complete search history.

(56) References Cited

U.S. PATENT DOCUMENTS

| | | | | |
|---|---|---|---|---|
| 5,493,252 A * | 2/1996 | Takai | .............................. | 330/52 |
| 6,408,079 B1 * | 6/2002 | Katayama et al. | .............. | 381/98 |
| 6,639,537 B1 * | 10/2003 | Raz | .............................. | 341/155 |
| 6,718,165 B1 * | 4/2004 | Ha | ............................. | 455/234.2 |
| 6,836,646 B2 * | 12/2004 | Nagasaka | ..................... | 455/126 |
| 6,873,275 B2 * | 3/2005 | Komamura et al. | ......... | 341/143 |
| 7,123,659 B2 * | 10/2006 | Orihashi et al. | .............. | 375/243 |
| 7,593,535 B2 * | 9/2009 | Shmunk | ...................... | 381/94.9 |

* cited by examiner

Primary Examiner — Lam T Mai

(57) ABSTRACT

The present invention provides an advanced adaptive predistortion linearization technique to dramatically reduce nonlinear distortion in power amplifiers over a very wide instantaneous bandwidth (up to 2 GHz) and over a wide range of amplifier types, input frequencies, signal types, amplitudes, temperature, and other environmental and signal conditions. In an embodiment of the invention, the predistortion linearization circuitry comprises (1) a higher-order polynomial model of an amplifier's gain and phase characteristics—higher than a third-order polynomial model; (2) an adaptive calibration technique; and (3) a heuristic calibration technique. The higher-order polynomial model is generated by introducing, for example, a plurality of multi-tone test signals with varying center frequency and spacing into the power amplifier. From the power amplifier's corresponding output, the nonlinearities are modeled by employing a higher-order curve fit to capture the irregularities in the nonlinear transfer function. Different distortion transfer functions can be implemented for different operating conditions. The adaptive calibration technique is based on a feedback analysis technique, which updates the applicable distortion transfer function by analyzing the error signal between the introduced input signal and the output signal in real-time. The heuristic calibration technique implements different distortion transfer functions based on historical operating conditions and optimal configurations of the power amplifier.

24 Claims, 7 Drawing Sheets

LINEARIZER

CROSS-REFERENCE TO RELATED APPLICATIONS

The present application is a continuation of U.S. patent application Ser. No. 12/817,075, entitled "Amplifier Linearizer," and filed Jun. 16, 2010 now U.S. Pat. No. 7,940,198, which is a continuation-in-part of U.S. patent application Ser. No. 12/112,380, entitled "Adaptive Mismatch Compensators and Methods for Mismatch Compensation," and filed Apr. 30, 2008 (issued as U.S. Pat. No. 7,782,235 on Aug. 24, 2010), both disclosures of which are incorporated by reference herein in their entirety. U.S. patent application Ser. No. 12/112,380 claims priority under 35 U.S.C. §119(e) to U.S. Provisional Patent Application No. 60/915,110 filed on Apr. 30, 2007, the disclosure of which is incorporated by reference herein in its entirety. U.S. patent application Ser. No. 12/817,075 claims priority under 35 U.S.C. §119(e) to U.S. Provisional Patent Application No. 61/187,546, entitled "Amplifier Linearizer," and filed Jun. 16, 2009, the disclosure of which is incorporated by reference herein in its entirety.

BACKGROUND OF THE INVENTION

1. Field of Invention

The present invention relates to electronics and more specifically, to a technique for improving the linear performance of electrical components such as power amplifiers in radio frequency (RF) transceiver systems.

2. Description of Related Art

An electronic or power amplifier is a device for increasing the power of an input signal. Power amplifiers in most electronic systems are required to be "linear," in that they must accurately reproduce the signal present at their input to achieve efficiency and spectral purity. An amplifier that compresses its input or has a non-linear input/output relationship causes the output signal to splatter onto adjacent frequencies. This causes interference on other frequency channels. Power amplifiers tend to become more non-linear as their power increases towards their maximum rated output.

Power amplifier linearity and efficiency are crucial issues in the design of electronic systems. The power amplifier is one of the most import parts of and usually the largest single contributor to the power consumption of an RF system. Thus, it is desirable to maximize the efficiency of a power amplifier. However, the more efficient power amplifier configuration is used the more nonlinear it usually becomes. Linearity errors in power amplifiers cause harmonic distortion and intermodulation distortion, which can limit the performance of state-of-the-art electronic systems such as, but not limited to radar systems, digital transceivers for wireless 3G and 4 G communications, laboratory test equipment, medical imaging, and audio and video compression. Reducing errors in digital-to-analog converters, analog-to-digital converters, sample-and-hold circuitry, and buffer and power amplifiers can significantly improve the performance of the critical conversion process.

Several common linearization methods exist for improving the linearity of power amplifiers, all of which suffer from drawbacks. All conventional linearization methods are limited in their maximum correctable range, which is the region of power output level near the onset of saturation. One method, known as a feedforward technique, is frequently employed and improves linearity, but results in poor power amplifier efficiency.

Predistortion is another technique used to improve the linearity of amplifiers. Digital predistortion is used to linearize the nonlinear response of a power amplifier over its intended power range. A predistortion circuit inversely models an amplifier's gain and phase characteristics and, when combined with the amplifier, produces an overall system that is more linear and reduces the amplifier's distortion. In essence, "inverse distortion" is introduced into the input of the amplifier, thereby cancelling to some degree any non-linearity the amplifier might have. However, the effectiveness of any predistortion technique is directly dependent on the accuracy of the predistortion transfer function, i.e., the model of the amplifier's gain and phase distortion characteristics. Traditional predistortion techniques implement a second-order or third-order polynomial as the transfer function, which improves the linearity of a power amplifier. However, for advanced RF systems with very high instantaneous bandwidths, transfer functions based on second-order or third-order polynomials are not accurate enough to prevent all non-linear distortion. In fact, many RF devices produce irregular nonlinearities that are difficult to model with standard, integer-power polynomial functions. Moreover, traditional predistortion techniques typically employ only one transfer function for a power amplifier, which may be suitable for a particular set of operating conditions. However, when operating conditions vary, e.g., temperature, time, or frequency, the transfer function may no longer be suitable to adequately remove non-linear distortion. Accordingly, there is a need for an improved linearization technique that implements higher-order transfer functions and accounts for varying operating conditions.

SUMMARY OF THE INVENTION

The present invention overcomes these and other deficiencies of the prior art by providing an advanced adaptive predistortion linearization technique to dramatically reduce nonlinear distortion in power amplifiers over a very wide instantaneous bandwidth (up to 2 GHz) and over a wide range of amplifier types, input frequencies, signal types, amplitudes, temperature, and other environmental and signal conditions. The present invention adaptively tracks nonlinear distortion and cancels out the errors. Advanced processing is performed in the background in real-time to adaptively track parameters that drift. By compensating for nonlinear compression effects in power amplifiers, the technique improves the amplifier efficiency by operating closer to saturation than with traditional amplifiers. Therefore, lower power, lower mass, and lower cost amplifiers can be used in place of inefficient, high-power amplifiers.

In an embodiment of the invention, a distortion compensator for removing nonlinear distortion introduced by an electronic system comprises: distortion transfer function circuitry comprising a number of nonlinear distortion models, and an equal number of gain/phase shift filters, wherein each gain/phase shift filter is coupled to a corresponding nonlinear distortion model; and an adaptive nonlinear distortion estimator, wherein the adaptive nonlinear distortion estimator generates updated transfer function parameters and filter coefficients for input into the distortion transfer function circuitry during operation of the electronic system. The distortion transfer function circuitry implements the updated transfer function parameters and filter coefficients without disrupting normal operation of the electronic system. One of the nonlinear distortion models may implement an $N^{th}$ order polynomial, where N is greater than three (3). The nonlinear distortion models may comprise: a first nonlinear distortion model comprising an even order polynomial model for removing symmetric, even order, distortion components, and a second nonlinear distortion model comprising an odd order polynomial model for removing asymmetric, odd order, distortion components. The even order nonlinear distortion model is of the $X^{th}$ order where X is an even integer greater than or equal to eight (8), and the odd order polynomial model is of the $Y^{th}$ order where Y is an odd integer greater than or equal to seven (7). X can be equal to twelve (12) and Y can be equal to thirteen (13). One of the nonlinear distortion models can comprise a polynomial having at least one non-integer exponent. The distortion compensator may further comprise a means for interpolation of an input signal to the distortion transfer circuitry. The means for interpolation comprises an upsampler for increasing the sampling rate of the input signal, a filter for removing aliased content, and a downsampler. The adaptive nonlinear distortion estimator processes a feedback signal tapped from an output of the electronic system to generate the updated transfer function parameters and filter coefficients. The updated transfer function parameters are used to adjust the nonlinear distortion models and the filter coefficients are used to adjust the gain/phase shift filters. A nonlinear distortion model is produced by curve fitting a distortion profile resulting from injection of a plurality of multi-tone test signals into the electronic system. The electronic system may comprise an RF transceiver. The distortion compensator may further comprise heuristic calibration circuitry comprising: a nonlinear distortion cataloger for storing one or more sets of transfer function parameters and filter coefficients associated with various operating conditions of the electronic system, wherein the operating conditions comprise mode of operation, temperature, and/or time. The nonlinear distortion cataloger provides a set of transfer function parameters and filter coefficients to the distortion transfer function circuitry upon sensing a change in operating condition. One of the nonlinear distortion models comprises a mixer that multiplies a signal with a sinusoidal local oscillator signal to shift the frequency content of the signal to another frequency.

In another embodiment of the invention, a method for removing nonlinear distortion in an RF transceiver including an RF transmitter and an RF receiver comprises the steps of: receiving an input signal; applying a nonlinear distortion model to the input signal to create a modified input signal, wherein the nonlinear distortion model comprises a $N^{th}$ order polynomial model where N is greater than three (3); adjusting the gain and/or phase of the modified input signal according to one or more filter coefficients to create a predistorted input signal; adding the predistorted input signal to the input signal to create a compensated input signal; processing the compensated input signal via the RF transmitter to create a transmitter signal; processing the transmitter signal via the RF receiver to create a feedback signal; identifying nonlinear distortion in the feedback signal; and adjusting the nonlinear distortion model and/or the filter coefficients according to the identified nonlinear distortion in the feedback signal. The method may further comprise the step of interpolating the input signal prior to the step of applying the nonlinear distortion model. The steps of applying the nonlinear distortion model to the input signal to create a modified input signal and adjusting the gain and/or phase of the modified input signal to create a predistorted input signal comprise the steps of: splitting the input signal into a number of channels, applying a different nonlinear distortion model to each of the plurality of channels to create a modified signal on each channel, and adjusting the gain and/or phase of the modified signal on each channel. The number of channels can be equal to two (2), and the different nonlinear distortion models comprise: a first nonlinear distortion model comprising an even order polynomial model for removing symmetric, even order, distortion components, and a second nonlinear distortion model comprising an odd order polynomial model for removing asymmetric, odd order, distortion components. The even order nonlinear distortion model is of the $X^{th}$ order where X is an even integer greater than or equal to eight (8), and the odd order polynomial model is of the $Y^{th}$ order where Y is an odd integer greater than or equal to seven (7). The method may further comprise the steps of: sensing a change in one or more operating conditions of the RF transceiver, wherein the one or more operating conditions comprise mode of operation, temperature, and time; and selecting the parameters of the nonlinear distortion model and/or the filter coefficients according to heuristic nonlinear distortion model parameters and filter coefficients associated with predetermined operating conditions.

In another embodiment of the invention, a distortion compensator for removing nonlinear distortion introduced by an electronic system comprises: means for applying a distortion transfer function to an input signal, means for adaptively calibrating the distortion transfer function, and means for heuristically calibrating the distortion transfer function. The distortion transfer function comprises: a first nonlinear distortion model comprising an even order polynomial model for removing symmetric, even order, distortion components, and a second nonlinear distortion model comprising an odd order polynomial model for removing asymmetric, odd order, distortion components. The distortion transfer function implements a first set of transfer function parameters and filter coefficients and the means for adaptively calibrating the distortion transfer function generates a second set of transfer function parameters and filter coefficients for implementation in the distortion transfer function based on an analysis of a feedback signal. The means for heuristically calibrating the distortion transfer function generates a third set of transfer function parameters and filter coefficients for implementation in the distortion transfer function based on a change in an operating condition of the electronic system. The operating condition is selected from the group consisting of: mode of operation, temperature, time, and a combination thereof.

The application of the linearity error compensation technique according to the present invention provides numerous advantages such as improving and maintaining extremely high performance of power amplifiers over a wider range of signal and environmental conditions, and adaptively tracking and correcting parameters which may drift with time, temperature, frequency, amplitude, etc. The present invention simplifies or eliminates outboard calibration, significantly improves power amplifier performance, provides built-in test capability (i.e., system failures can be detected and analyzed), and increases reliability of power amplifiers. The adaptive processing algorithms of the present invention efficiently share processing resources already present in adaptive systems (e.g., adaptive digital beamforming), and reduce the performance requirements of the analog circuitry because the digital signal processing is used to dramatically improve performance. In sum, the present invention lowers the cost, power, and size of power amplifiers while improving linearity and efficiency.

The foregoing, and other features and advantages of the invention, will be apparent from the following, more particular description of the preferred embodiments of the invention, the accompanying drawings, and the claims.

BRIEF DESCRIPTION OF THE DRAWINGS

For a more complete understanding of the present invention, the objects and advantages thereof, reference is now made to the ensuing descriptions taken in connection with the accompanying drawings briefly described as follows.

DETAILED DESCRIPTION OF EMBODIMENTS

Figure 1:
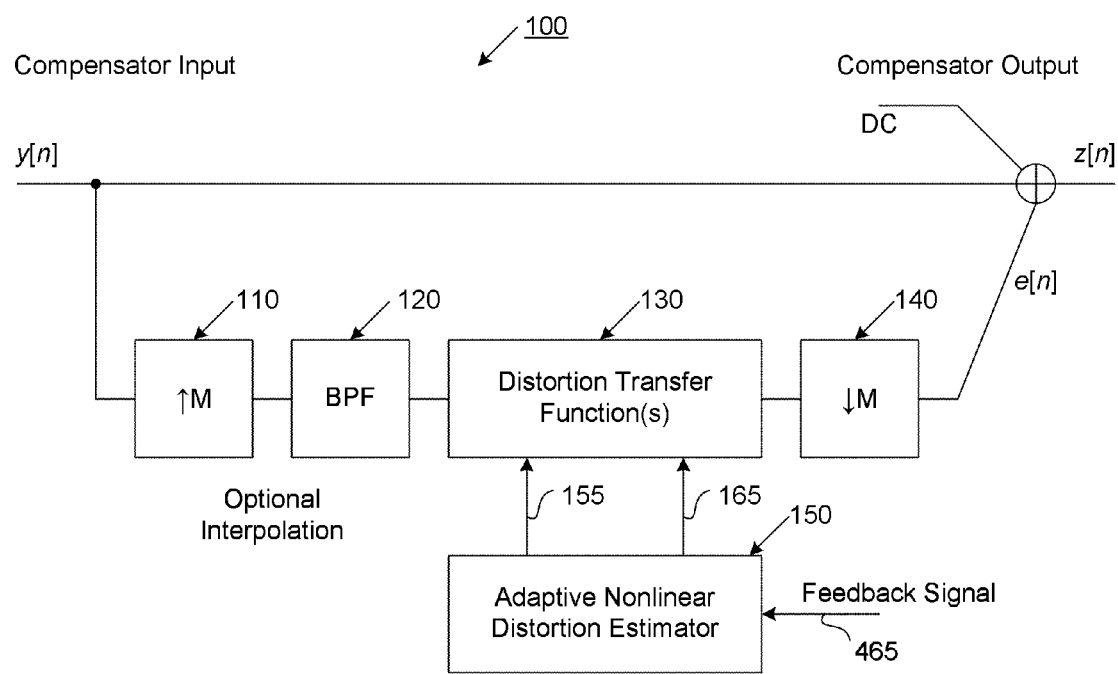
FIG. 1 illustrates a block diagram of a distortion compensator according to an embodiment of the invention.

Further features and advantages of the invention, as well as the structure and operation of various embodiments of the invention, are described in detail below with reference to the accompanying FIGS. 1-7, wherein like reference numerals refer to like elements. Although the present invention is described in the context of power amplifiers, one of ordinary skill in the art readily appreciates that the linearization techniques described herein are applicable to any type of electronic component where it is desired to accurately and adequately eliminate inherent non-linear errors.

In general, the predistortion linearization circuitry of the present invention implements, among other things, (1) a higher-order polynomial model of an amplifier's gain and phase characteristics—higher than a third-order polynomial model; (2) an adaptive calibration technique; and (3) a heuristic calibration technique. The higher-order polynomial model is generated by introducing, for example, a plurality of multi-tone test signals with varying center frequency and spacing into the power amplifier. From the power amplifier's corresponding output, the nonlinearities are modeled by employing a higher-order curve fit to capture the irregularities in the nonlinear transfer function. Different transfer functions can be implemented for different operating conditions. The adaptive calibration technique is based on a feedback analysis technique, which updates the applicable transfer function by analyzing the error signal between the introduced uncompensated input signal and the compensated output signal in real-time. The heuristic calibration technique implements different transfer functions based on historical operating conditions and optimal configurations of the power amplifier.

FIG. 1 illustrates a block diagram of a distortion compensator 100 according to an embodiment of the invention. The distortion compensator 100 operates in the digital domain and serves as a general linearity error compensator that accurately nulls distortion by combining a predistortion signal e[n] with an input signal y[n] to produce a compensated output signal z[n], such that:

$$y[n]+e[n]=z[n]$$

The distortion compensator 100 is coupled to an RF transmission chain (not shown) and digital signal processing circuitry (not shown) as part of an RF communications system. A typical RF chain comprises a digital-to-analog converter, one or more filters, upconversion circuitry, a high-power amplifier (HPA), and an RF antenna. Although the present disclosure is described in the context of predistortion, i.e., pre-processing circuitry, the linearization techniques described herein can be implemented as digital post-processing circuitry to compensate for distortion introduced by an RF receiving chain. A typical RF receiving chain (not shown) comprises an RF antenna, a low-noise amplifier (LNA), downconversion circuitry, one or more filters, and an analog-to-digital converter. The implementation of an RF transmission chain, RF receiving chain, and digital signal processing circuitry in an RF transceiver system is readily apparent to one of ordinary skill in the art.

The distortion compensator 100 comprises an upsampler 110, a band-pass filter 120, a distortion transfer function circuitry 130, a downsampler 140, and an adaptive nonlinear distortion estimator 150. The inclusion of the upsampler 110, the band-pass filter 120, and the downsampler 140 is optionally employed in order to perform interpolation, the implementation of which is apparent to one of ordinary skill in the art. Interpolation increases the bandwidth of the distortion compensator 100 by estimating the compensator input signal, y[n], at intermediate points. This allows the compensator 100 to properly resolve harmonic and intermodulation distortion components that exceed the Nyquist bandwidth of the sampled system. In operation, the upsampler 110 increases the sampling rate of the compensator input signal, y[n], by a factor of M. The band-pass filter 120 preserves the fundamental content of the compensator input signal, y[n], by removing content above and/or below the original Nyquist limit of the signal. The downsampler 140 decreases the sampling rate to the original sampling rate of the compensator input, y[n]. The downsampler 140 is coupled to an adder as shown.

Figure 2:
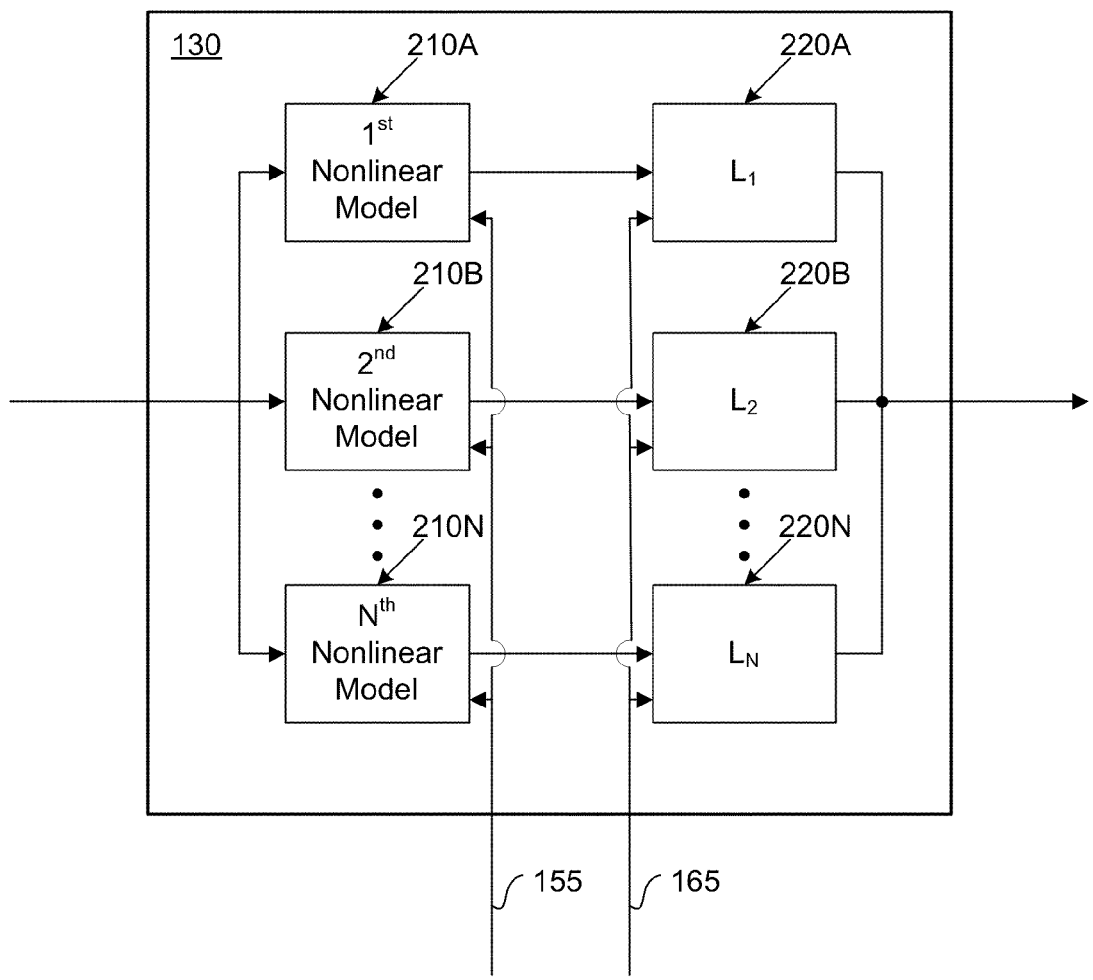
FIG. 2 illustrates a block diagram of the distortion transfer function circuitry of FIG. 1 according to an embodiment of the invention.

FIG. 2 illustrates a block diagram of the distortion transfer function circuitry 130 according to an embodiment of the invention. The distortion transfer function circuitry 130 is coupled to the band-pass filter 120 and the downsampler 140, and receives input signals 155 and 165 from the adaptive nonlinear distortion estimator 150. The distortion transfer function circuitry 130 can employ any number "N" of nonlinear distortion models. Referring to FIG. 2, the distortion function circuitry 130 comprises N number of nonlinear distortion models 210A-N and an equal number of gain/phase shift filters 220A-N. Each nonlinear distortion model 210I is coupled to a corresponding gain/phase shift filter 220I. Each gain/phase shift filter 220 comprises one or more digital filters (e.g., finite impulse response (FIR) filters of length 16 taps). In an embodiment of the invention, the digital filters are fit to the measured amplitude and phase variation across the desired frequency band using standard least mean squares (LMS) or minimization of maximum error (MINIMAX) filter design algorithms. The digital filters are key components that allow precise cancellation of the nonlinear distortion components as they vary in gain and phase over frequency.

In an embodiment of the invention, two nonlinear distortion models 210A and 210B are implemented. The nonlinear model 210A compensates for asymmetric, or odd order, distortion components. The nonlinear model 210B compensates for symmetric, or even order, distortion components. The gain/phase shift filter 220A or 220B is coupled to the respective nonlinear model 210A or 210B to dynamically adjust the distortion components such that they are canceled in the compensated output z[n] over a wide frequency band as described below.

Each nonlinear distortion model 210 is produced by curve fitting a measured distortion transfer function (i.e., distortion level as a function of input level). For example, curve fitting may be implemented using a MINIMAX technique, the implementation of which is apparent to one of ordinary skill in the art. Other curve fitting techniques can be employed such as, but not limited to an LMS methodology or a nonlinear statistical regression analysis, the implementation of all of which are apparent to one of ordinary skill in the art. In at least one embodiment of the invention, the nonlinear distortion models 210A and 210B comprise a $13^{th}$ order polynomial as the asymmetric transfer function and a $12^{th}$ order polynomial as the symmetric transfer function. However, higher order polynomials can be implemented if adequate processing resources are available. Nonetheless, from experimental results, $7^{th}$ order and $8^{th}$ order polynomials are usually adequate to compensate for asymmetric and symmetric nonlinear distortion when practicing the present invention. In another embodiment of the invention, a single nonlinear distortion model 210 is employed by implementing an even and odd order polynomial model. Alternatively, a single polynomial model is implemented where one or more of the exponents are not integers.

In at least one embodiment of the invention, the asymmetric and symmetric models 210A and 210B are fitted to an error distortion profile resulting from a plurality of injected test signals. In an exemplary embodiment of the invention, a set of 10 to 15 multi-tone test signals with varying center frequency and spacing is used to measure the resulting harmonic and intermodulation distortion components likely during manufacturing of the RF system. For each test signal, a buffer of approximately 128K samples is captured and the fast Fourier transformation (FFT) spectrum is analyzed, the implementation of which is apparent to one of ordinary skill in the art, to measure the relative amplitude and phase shift of each of the distortion components. The results are tabulated, and distortion transfer functions are calculated for the selected distortion components. The distortion transfer function is the measured level of the selected distortion components as a function of the input signal level. A higher order polynomial function as described above is fit to the measured distortion transfer functions to form the nonlinear distortion model, which represents the typical distortion behavior of the device.

Figure 3:
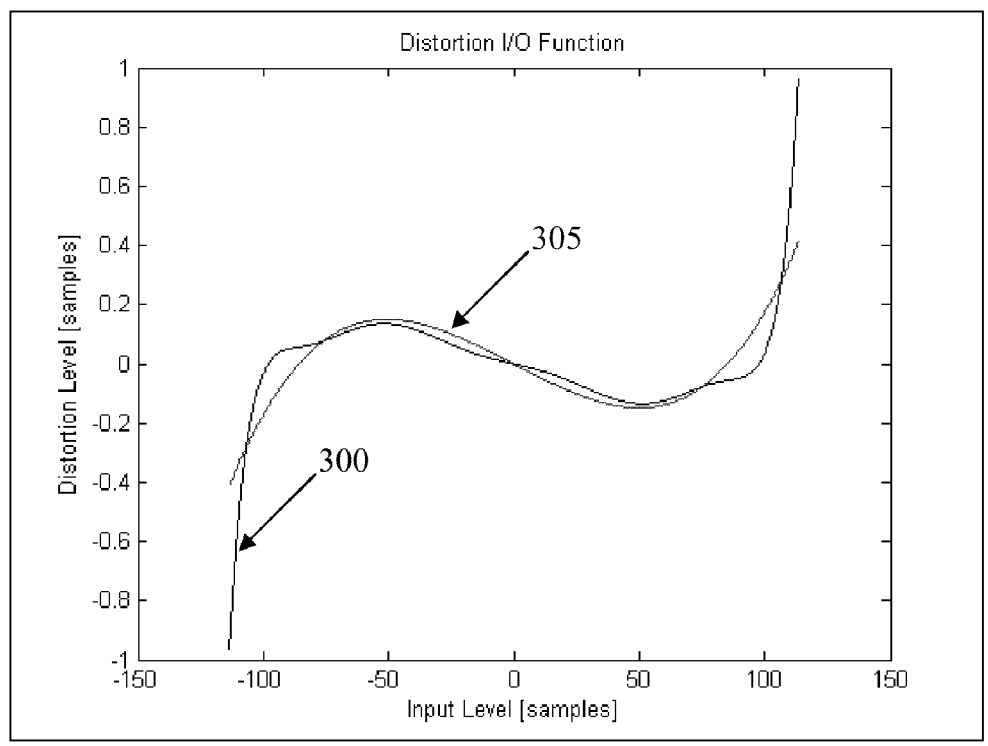
FIG. 3 illustrates exemplary asymmetric and symmetric distortion transfer functions according to an embodiment of the invention.
Figure 3:
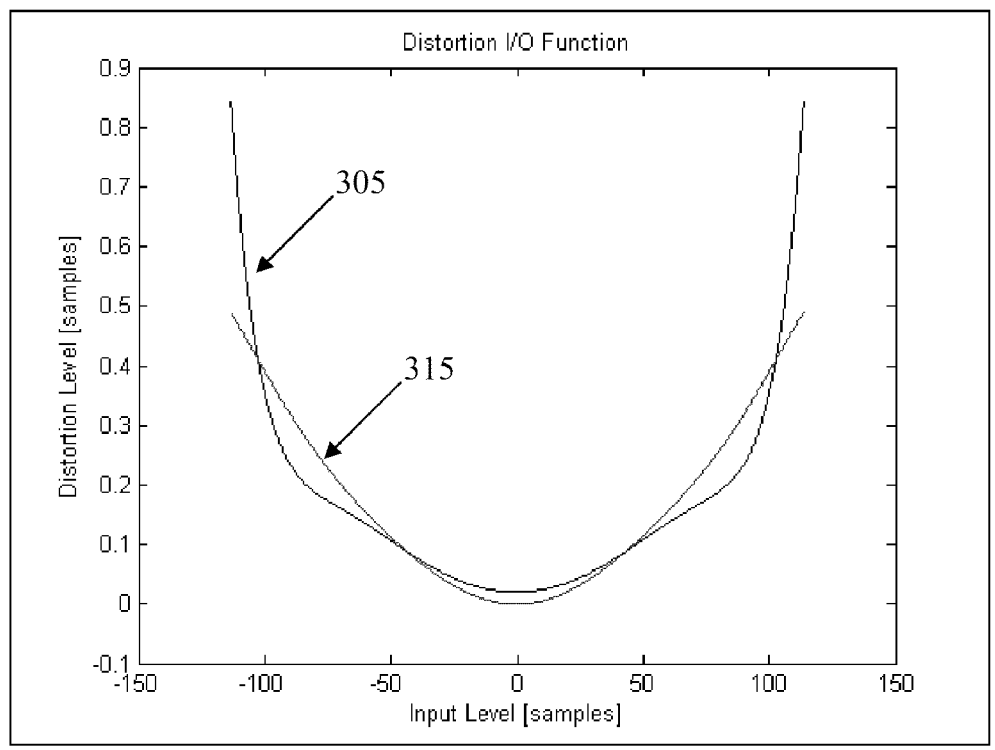

FIG. 3 illustrates exemplary asymmetric and symmetric distortion transfer functions 300 and 310 according to an embodiment of the invention. The asymmetric distortion function 300 accounts for odd order distortion components (e.g., up to the seventh-order) that are not possible to model accurately with a standard third-order polynomial function 305. The symmetric distortion transfer function 310 accounts for even order distortion components (e.g., up to the eighth-order) that are not possible to model accurately with a standard second-order polynomial function 315.

Referring back to FIG. 2, in an alternate embodiment of the invention, the nonlinear models 210A-N are configured for non-harmonically related distortion components, for example, mixing image products, clock leakage, adjacent channel leakage, and/or other interference or nonlinear distortion. To accurately model mixing image products, the nonlinear model 210A-N may include a mixer, which multiplies a signal with a sinusoidal local oscillator signal to shift its frequency content to another frequency. It may optionally include a bandpass filter to select one or more mixing image products.

Figure 4:
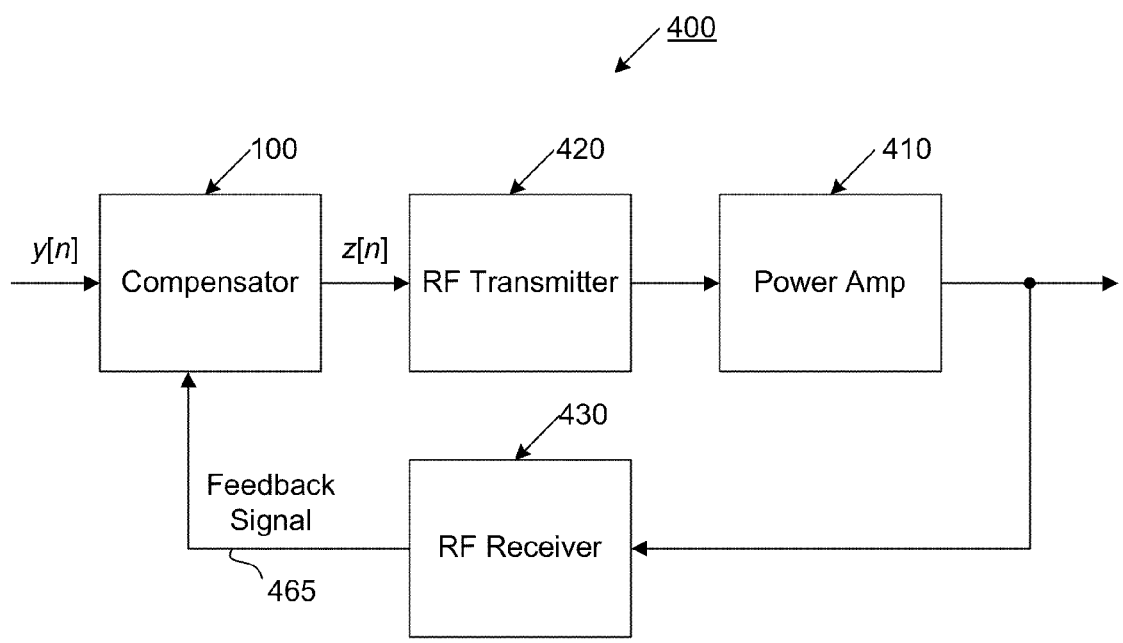
FIG. 4 illustrates an adaptive linearized power amplifier system according to an embodiment of the invention.

FIG. 4 illustrates an adaptive linearized power amplifier system 400 according to an embodiment of the invention. The system 400 comprises the compensator 100, an RF transmitter 420, a power amplifier 410, and an RF receiver 430. The RF transmitter 420 comprises a digital-to-analog converter and may optionally include RF upconversion electronics to convert a baseband signal to a higher RF. The power amplifier 410 amplifies the RF signal and introduces the undesired nonlinear distortion. The power amplifier 410 output is tapped and coupled to the RF receiver 430. The RF receiver 430 comprises an analog-to-digital converter and may optionally include RF downconversion electronics to convert the power amplifier output from RF to baseband. The feedback signal 465 is a digitized representation of the tapped power amplifier output, which is used by the compensator 100 to update its behavior, through the adaptive nonlinear distortion estimator 150, for optimal performance.

Figure 5:
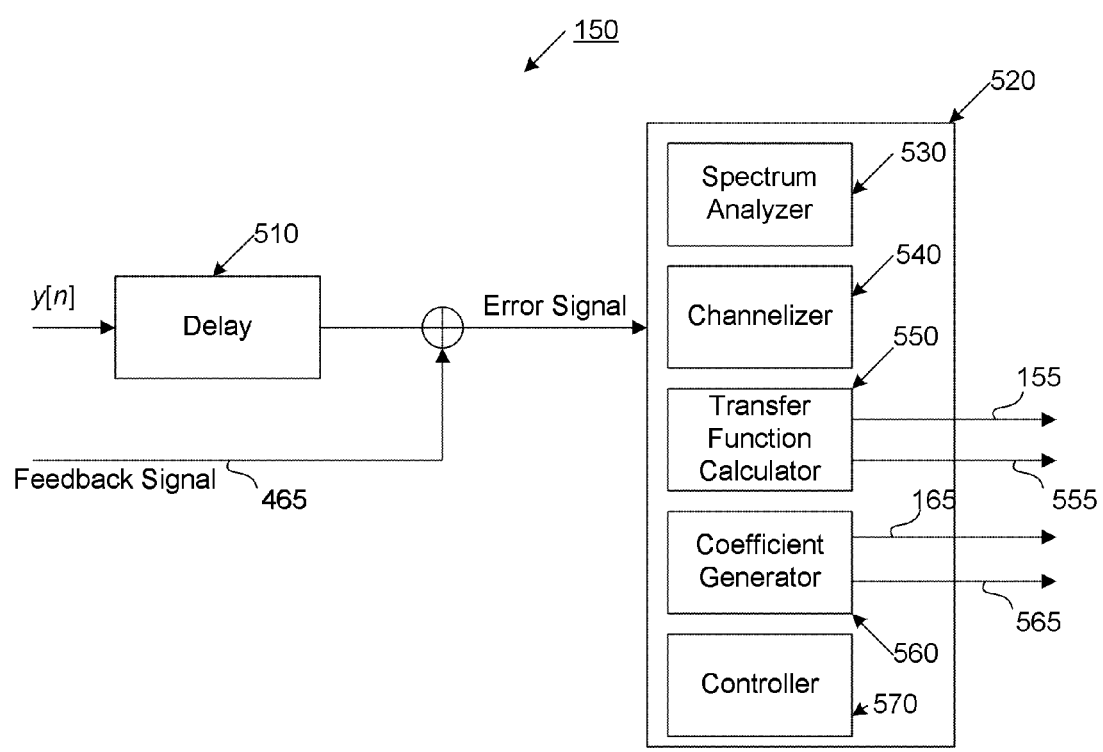
FIG. 5 illustrates the adaptive nonlinear distortion estimator of FIG. 1 according to an embodiment of the invention.

FIG. 5 illustrates the adaptive nonlinear distortion estimator 150 according to an embodiment of the invention. The estimator 150 comprises a delay 510 and a parameter updater 520. The delay 510 delays the system input, y[n], so that it properly aligns with the feedback signal 465, which is a digitized representation of the power amplifier 410 output and is subject to delays incurred in the processing and circuitry of the system 400. The delayed input signal is combined with the feedback signal 465 via an adder to subtract out an error signal between the compensated output signal, z[n], and the uncompensated signal, y[n]. The error signal is a representation of the difference between the input uncompensated signal, y[n], and the amplifier output, which includes the nonlinear distortion components that the compensator 100 corrects.

This error signal is introduced to the parameter updater 520. The parameter updater 520 comprises a spectrum analyzer 530, a channelizer 540, a transfer function calculator 550, a coefficient generator 560, and a controller 570, the implementation of all of which are apparent to one of ordinary skill in the art. Upon processing of the error signal, the transfer function calculator 550 outputs updated transfer function parameters 155, which are used by the nonlinear distortion transfer function circuitry 130 to further refine the nonlinear models 210A-N. The coefficient generator 560 outputs updated filter coefficients 165, which are used by the gain/phase shift filters 220A-N to fine tune the overall predistortion. The spectrum analyzer 530 evaluates the spectral content of the error signal, for example, with an FFT operation. The controller 570 uses this spectral content information to determine if the current signal is suitable for estimation of the nonlinear distortion components. For example, if the signal levels are currently too low for accurate estimation, then the controller will wait for a larger signal to appear before continuing with the estimation. The channelizer 540 partitions the error signal into frequency subbands, for example, with a digital filter bank, to analyze the distortion components over different frequencies.

The transfer function calculator 550 stores a table of the current distortion transfer function that maps the delayed input signal to the error signal, for example, in random access memory (RAM). The transfer function calculator 550 may also use a curve-fitting algorithm, the identification and implementation of which are apparent to one of ordinary skill in the art, to fit a polynomial equation to the transfer function. The calculator 550 outputs transfer function parameters 155, which may be this equation or the memory table. The calculator 550 optionally outputs similar transfer function parameters 555, which may be this equation or the memory table, for use in a heuristic compensation process described below. The coefficient generator 560 uses the output of the spectrum analyzer 530 to measure the relative gain and phase shift of the selected nonlinear distortion components. These gain and phase shift measurements are cataloged over frequency for different input signals. Standard digital filter design methods may be used to fit a digital filter to the gain and phase shift measurements to generate the coefficients 165 of the gain/ phase shift filters 220A-N. The generator 560 optionally outputs coefficients 565 for use in a heuristic compensation process described below.

In essence, the adaptive nonlinear distortion estimator 150 serves as a blind adaptive calibration routine to significantly simplify or even eliminate system calibration, i.e., the adaptive routine can be used to monitor the system output, z[n], and interactively adjust the nonlinear models 210A-N and the gain/phase shift filters 220A-N to minimize the nonlinear distortion without requiring any external calibration signal sources or by requiring the interruption of the normal operation of the system. The blind adaptive calibration routine does not require the use of a pilot signal to characterize the system, which eliminates the need to generate test signals during operation of the applicable RF communications system. Since the mathematical relationship between the desired output and the nonlinear error signals is known for arbitrary input signals, this relationship can be used to estimate the amplitude and phase of the error signals. The blind adaptive calibration routine (implemented, for example, in a digital signal process) iteratively adjusts the digital filters to subtract (or null) these error signals from the output signal. FFT analysis (or other wavelet time-frequency analysis) can be used to measure how accurately the error signals have been nulled. Accurate nulling of these error signals means the processing is optimized.

In at least one embodiment of the invention, heuristic calibration is further implemented. Heuristic calibration maintains and updates the calibration history over numerous operating conditions, e.g., time, temperature, frequency, etc. For example, distortion transfer functions are generated for various sets of operating conditions and are stored in a look-up table. In the event that operating conditions change, an applicable higher order asymmetric and symmetric transfer function can be loaded into the nonlinear models 210A-N or an applicable set of filter coefficients 165 can be loaded into the gain/phase shift filters 220A-N, or both. This permits the compensator 100 to quickly switch to an optimal configuration, which will be further refined through the blind adaptive calibration technique discussed above.

Figure 6:
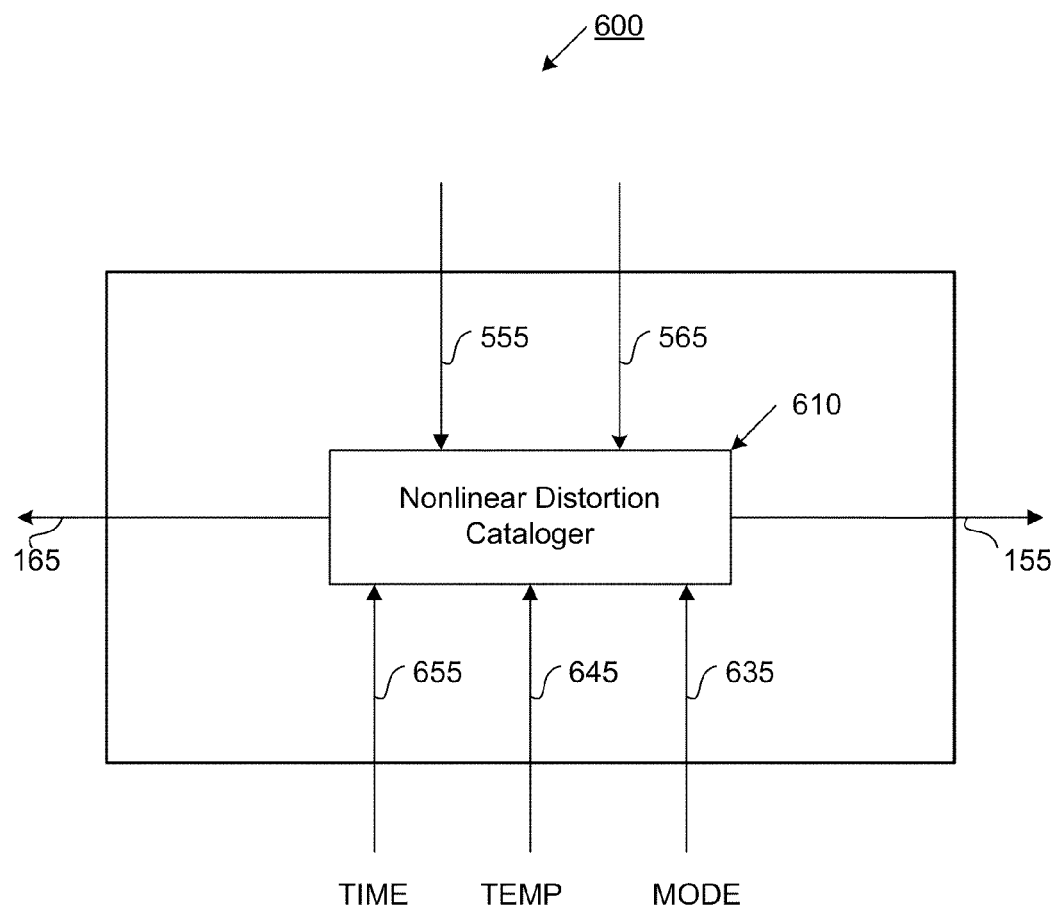
FIG. 6 illustrates a heuristic calibration system according to an embodiment of the invention.

FIG. 6 illustrates a heuristic calibration system 600 according to an embodiment of the invention. Particularly, the heuristic calibration system 600 comprises a nonlinear distortion cataloger 610, which stores a history of various measurements, including, but not limited to transfer function parameters 555, filter coefficients 565, and other relevant parameters such as mode of operation 635, temperature 645, and time 655. The nonlinear distortion cataloger 610 outputs distortion transfer function parameters 155 and updated filter coefficients 165 that are calculated heuristically based on the current operation conditions, such as time, temperature, and mode of operation. The nonlinear distortion cataloger 610 can record a number of different measurements to allow for accurate interpolation or extrapolation of the transfer function parameters 155 and updated filter coefficients 165, given the RF system's current operating mode, current temperature, other current conditions, and over a range of frequencies. This record of different measurements can be stored in a catalog (not shown). The nonlinear distortion cataloger 610 can extract the most relevant measurements from the catalog in response to the current operating conditions of the system.

In an exemplary embodiment of the invention, the nonlinear distortion cataloger 61 can extract all of the nonlinear distortion level measurements that have been stored in the catalog that are for the current operating mode 635, within 5 degrees Celsius of the current temperature 645, with the last 30 seconds of the current time 655, and over all the frequencies at which measurements have been stored in the mismatch catalog. Repeated measurements at the same frequency can be averaged for a more accurate estimation. Missing measurements for particular frequencies can be interpolated or extrapolated from the extracted measurements. Measurements that vary significantly from previously stored measurements can be discarded since they may indicate a measurement glitch. This process performed by the nonlinear distortion cataloger 610 of extracting the relevant data from the catalog, combining repeated measurements, interpolating or extrapolating missing measurements, and discarding inaccurate measurements is a heuristic process that generates the transfer function parameters 155 and updated filter coefficients 165.

Figure 7:
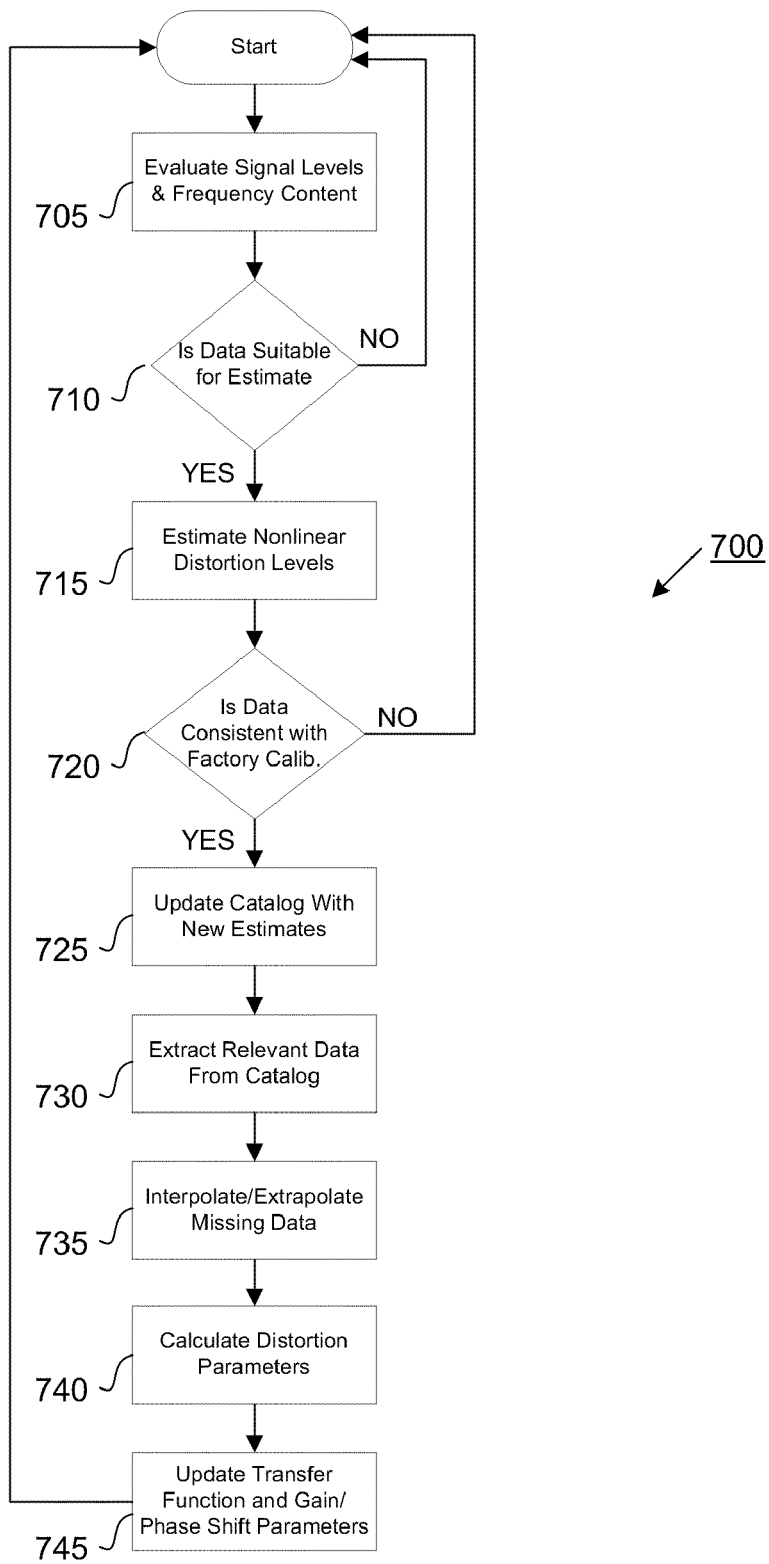
FIG. 7 illustrates a process for heuristically compensating nonlinear distortion according to an embodiment of the invention.

FIG. 7 illustrates a process 700 for heuristically compensating nonlinear distortion according to an embodiment of the invention. This process 700 is controlled by the nonlinear distortion cataloger 610 as shown in FIG. 6. The nonlinear distortion cataloger 610 can be implemented as a microprocessor or an embedded processor with a field programmable gate array. Particularly, the process 700 begins by evaluating (step 705) the amplitudes and frequency content of the nonlinear distortion levels and determining (step 710) if that data is suitable for accurate estimation of the nonlinear distortion. The accuracy of the estimation can be degraded, for example, if the signal levels are very low (for example, less that −20 dBFS); therefore, for the most accurate estimation, the process can continually monitor the incoming signal until its amplitude is above a predetermined threshold. The single amplitude and frequency content can be measured, in one embodiment, with a FFT analysis of the input signals. A 512 point FFT can be performed with a microprocessor or embedded processor, and the magnitude of each FFT bin can be measured to determine the signal amplitude at various frequencies.

If the signal amplitude and frequency content is suitable, then the nonlinear distortion levels can be estimated (step 715). Optionally, the current estimations can be compared (step 720) to the factory calibration values stored in the catalog to insure that the current estimations are not significantly different. A significant difference can indicate a component failure, a signal glitch, or other anomaly, whereby a determination can be made that the current estimation is not valid. If the current estimation is determined to be valid, then the new estimates are stored (step 725) in the catalog.

Based on the current operating conditions, such as current operating mode 635, temperature 645, and time 655, the catalog is searched and any relevant measurements are extracted (step 730), such as measurements near the current system temperature or having the same operating ode. If any pertinent measurements are missing from the catalog, they can be interpolated or extrapolated (step 735). For example, the catalog may contain estimates at a few different frequencies, but the values at the remaining frequencies can be interpolated or extrapolated using, in at least one embodiment of the invention, spline data fitting algorithms. Based on the interpolated/extrapolated data, the optimal nonlinear distortion parameters 155 and 165 can be calculated (step 740). The parameters are used to update (step 745) the nonlinear models 210A-N and the gain/phase shift filters 220A-N Referring back to FIG. 5, the controller 570 operates in the background to guide the processing of data with the spectrum analyzer 530, channelizer 540, transfer function calculator 550, coefficient generator 560, and nonlinear distortion cataloger 610. The controller 570 may be implemented with a digital signal processor or an embedded processor, for example, a field programmable gate array. A program instantiated in the controller 570 can implement the process 700 for heuristically compensating nonlinear distortion, as shown in FIG. 7.

The controller 570 may also implement an iterative optimization algorithm that repeatedly analyzes the error signal via the spectrum analyzer 530 to adjust the transfer function calculator 550 and the coefficient generator 560 for optimal performance. Standard iterative optimization algorithms, such as a binary search or Newton's Method may be used. For example, the filter coefficients 165 calculated by the coefficient generator 560 may be iteratively optimized to adjust the amplitude and/or phase shift of the predistortion signal such that the selected distortion components are nulled in the output.

In general, the power specification for an amplifier is chosen based on the type of signal to be transmitted (e.g., the peak-to-average signal level), the desired power output, and the desired dynamic range (e.g., third-order intercept point (IP3), 1 dB compression point). Conventional amplifiers are often backed off such that the peak power does not exceed the 1 dB compression point (typically, amplifiers are backed off even a few dB more to insure signals remain in the linear operating region). For example, a typical communications signal may have a peak-to-average ratio of 9 dB, so the amplifier may be backed off by approximately 12 dB below its 1 dB compression point to insure linear amplification. The present invention can be used to increase the 1 dB compression point by 3 to 6 dB, which allows the back-off to be reduced commensurately. This corresponds to reducing the necessary power rating for the amplifier by one-half to one-quarter, which significantly improves the amplifier efficiency (i.e., as the back-off decreases, the efficiency increases). Moreover, the present invention provides a 35 to 40 dB improvement to the spurious free dynamic range (SFDR). Conventional linearization techniques only provide a 10 dB improvement.

Standard, commercially-available field programmable gate array (FPGA) chips are capable of digital signal processing at approximately 300 MHz data rate. For data rates higher than 300 MHz, the processing can be transformed into simultaneous parallel channels, for example, using polyphase filtering structures. For example, 4 GHz data can be demultiplexed into 16 lower data rate (250 MHz each) channels for real-time parallel processing in a standard FPGA (providing an instantaneous bandwidth of 2 GHz).

Linearity compensation techniques are described in commonly-owned U.S. Pat. No. 6,198,416, and calibration techniques are described in U.S. patent application Ser. No. 12/112,380, entitled "Adaptive Mismatch Compensators and Methods for Mismatch Compensation," the disclosures of which are incorporated by reference herein in their entirety.

The present invention is applicable to a wide range of military and commercial applications including, but not limited to: advanced radar systems; software-defined radios; multi-beam adaptive digital beamforming array transceivers; smart radios for wireless communications (terrestrial and satellite); wideband electronic warfare transceivers; general test equipment such as oscilloscopes, spectrum analyzers, and network analyzers; special test equipment, wide bandwidth modems, anti-jam global positioning system (GPS) receivers, and active radar for Earth science measurements.

The invention has been described herein using specific embodiments for the purposes of illustration only. It will be readily apparent to one of ordinary skill in the art, however, that the principles of the invention can be embodied in other ways. Therefore, the invention should not be regarded as being limited in scope to the specific embodiments disclosed herein, but instead as being fully commensurate in scope with the following claims.

I claim:

1. A distortion compensator for removing nonlinear distortion introduced by an electronic system, the distortion compensator comprising:
   distortion transfer function circuitry comprising
      a number of nonlinear distortion models, and
      an equal number of gain/phase shift filters, wherein each gain/phase shift filter is coupled to an input of a corresponding nonlinear distortion model; and
   an adaptive nonlinear distortion estimator, wherein the adaptive nonlinear distortion estimator generates updated transfer function parameters and filter coefficients for input into the distortion transfer function circuitry during operation of the electronic system.

2. The distortion compensator of claim 1, wherein the distortion transfer function circuitry implements the updated transfer function parameters and filter coefficients without disrupting normal operation of the electronic system.

3. The distortion compensator of claim 1, wherein one of the nonlinear distortion models comprises a $N^{th}$ order polynomial, where N is greater than three (3).

4. The distortion compensator of claim 1, wherein the number of nonlinear distortion models comprise:
   a first nonlinear distortion model comprising an even order polynomial model for removing symmetric, even order, distortion components, and
   a second nonlinear distortion model comprising an odd order polynomial model for removing asymmetric, odd order, distortion components.

5. The distortion compensator of claim 4, wherein the even order nonlinear distortion model is of the $X^{th}$ order where X is an even integer greater than or equal to eight (8), and the odd order polynomial model is of the $Y^{th}$ order where Y is an odd integer greater than or equal to seven (7).

6. The distortion compensator of claim 5, wherein X is equal to twelve (12) and Y is equal to thirteen (13).

7. The distortion compensator of claim 1, wherein one of the nonlinear distortion models comprises a polynomial having at least one non-integer exponent.

8. The distortion compensator of claim 1, further comprising a means for interpolation of an input signal to the distortion transfer circuitry.

9. The distortion compensator of claim 8, wherein the means for interpolation comprises an up sampler for increasing the sampling rate of the input signal, a filter for removing aliased content, and a downsampler.

10. The distortion compensator of claim 1, wherein the adaptive nonlinear distortion estimator processes a feedback signal tapped from an output of the electronic system to generate the updated transfer function parameters and filter coefficients.

11. The distortion compensator of claim 10, wherein the updated transfer function parameters are used to adjust the nonlinear distortion models and the filter coefficients are used to adjust the gain/phase shift filters.

12. The distortion compensator of claim 1, wherein a nonlinear distortion model is produced by curve fitting a distortion profile resulting from injection of a plurality of multi-tone test signals into the electronic system.

13. The distortion compensator of claim 1, wherein the electronic system comprises an RF transceiver.

14. The distortion compensator of claim 1, further comprising heuristic calibration circuitry comprising:

a nonlinear distortion cataloger for storing one or more sets of transfer function parameters and filter coefficients associated with various operating conditions of the electronic system, wherein the operating conditions comprise mode of operation, temperature, and/or time.

15. The distortion compensator of claim 14, wherein the nonlinear distortion cataloger provides a set of transfer function parameters and filter coefficients to the distortion transfer function circuitry upon sensing a change in operating condition.

16. The distortion compensator of claim 1, wherein one of the nonlinear distortion models comprises a mixer that multiplies a signal with a sinusoidal local oscillator signal to shift the frequency content of the signal to another frequency.

17. The distortion compensator of claim 1, wherein the distortion transfer function circuitry further comprises an additional gain/phase shift filter coupled to the output of one of the number of nonlinear distortion models.

18. A method for removing nonlinear distortion in an RF transceiver including an RF transmitter and an RF receiver, the method comprising the steps of:
  receiving an input signal;
  adjusting the gain and/or phase of the input signal according to one or more filter coefficients to create a modified input signal;
  applying a nonlinear distortion model to the modified input signal to create a predistorted input signal, wherein the nonlinear distortion model comprises a $N^{th}$ order polynomial model where N is greater than three (3);
  adding the predistorted input signal to the input signal to create a compensated input signal;
  processing the compensated input signal via the RF transmitter to create a transmitter signal;
  processing the transmitter signal via the RF receiver to create a feedback signal;
  identifying nonlinear distortion in the feedback signal; and
  adjusting the nonlinear distortion model and/or the filter coefficients according to the identified nonlinear distortion in the feedback signal.

19. The method of claim 18, further comprising the step of interpolating the input signal prior to the step of applying the nonlinear distortion model.

20. The method of claim 18, wherein the steps of adjusting the gain and/or phase of the input signal to create a modified input signal and applying a nonlinear distortion model to the modified input signal to create a predistorted input signal comprise the steps of:
  splitting the input signal into a number of channels,
  adjusting the gain and/or phase of the input signal on each channel, and
  applying a different nonlinear distortion model to each of the plurality of channels to create a predistorted input signal on each channel.

21. The method of claim 20, wherein the number of channels is equal to two (2), and the different nonlinear distortion models comprise:
  a first nonlinear distortion model comprising an even order polynomial model for removing symmetric, even order, distortion components, and
  a second nonlinear distortion model comprising an odd order polynomial model for removing asymmetric, odd order, distortion components.

22. The method of claim 21, wherein the even order nonlinear distortion model is of the $X^{th}$ order where X is an even integer greater than or equal to eight (8), and the odd order polynomial model is of the $Y^{th}$ order where Y is an odd integer greater than or equal to seven (7).

23. The method of claim 18, further comprising the steps of:
  sensing a change in one or more operating conditions of the RF transceiver, wherein the one or more operating conditions comprise mode of operation, temperature, and time; and
  selecting the parameters of the nonlinear distortion model and/or the filter coefficients according to heuristic nonlinear distortion model parameters and filter coefficients associated with predetermined operating conditions.

24. The method of claim 18, further comprising the step of adjusting the gain and/or phase of the predistorted input signal according to one or more filter coefficients.

* * * * *